(12) United States Patent
Prince et al.

(10) Patent No.: US 8,999,203 B2
(45) Date of Patent: *Apr. 7, 2015

(54) ALUMINUM PASTES AND USE THEREOF IN THE PRODUCTION OF PASSIVATED EMITTER AND REAR CONTACT SILICON SOLAR CELLS

(75) Inventors: Alistair Graeme Prince, Bristol (GB); Richard John Sheffield Young, Somerset (GB); Giovanna Laudisio, Bristol (GB); Gary Coultart, Bristol (GB); Kenneth Warren Hang, Hillsborough, NC (US); Ben Whittle, Bristol (GB)

(73) Assignee: E I du Pont de Nemours and Company, Wilmington, DE (US)

( * ) Notice: Subject to any disclaimer, the term of this patent is extended or adjusted under 35 U.S.C. 154(b) by 1086 days.

This patent is subject to a terminal disclaimer.

(21) Appl. No.: 12/952,694

(22) Filed: Nov. 23, 2010

(65) Prior Publication Data

US 2011/0120535 A1    May 26, 2011

Related U.S. Application Data

(60) Provisional application No. 61/264,335, filed on Nov. 25, 2009.

(51) Int. Cl.
| | |
|---|---|
| *H01B 1/02* | (2006.01) |
| *H01B 1/12* | (2006.01) |
| *H01B 1/22* | (2006.01) |
| *H01L 31/0224* | (2006.01) |

(52) U.S. Cl.
CPC .......... *H01B 1/22* (2013.01); *H01L 31/022425* (2013.01); *Y02E 10/50* (2013.01)

(58) Field of Classification Search
None
See application file for complete search history.

(56) References Cited

U.S. PATENT DOCUMENTS

| | | | | |
|---|---|---|---|---|
| 7,494,607 | B2 * | 2/2009 | Wang et al. | 252/514 |
| 8,309,844 | B2 * | 11/2012 | Merchant et al. | 136/256 |
| 2006/0231803 | A1 * | 10/2006 | Wang et al. | 252/500 |
| 2009/0120490 | A1 * | 5/2009 | Huang et al. | 136/252 |
| 2011/0240124 | A1 * | 10/2011 | Laudisio et al. | 136/261 |
| 2013/0056060 | A1 * | 3/2013 | Fuge et al. | 136/256 |
| 2013/0183795 | A1 * | 7/2013 | Akimoto et al. | 438/98 |

FOREIGN PATENT DOCUMENTS

| | | |
|---|---|---|
| EP | 1713095 A2 | 10/2006 |
| EP | 1732136 A2 | 12/2006 |
| EP | 1732137 A2 | 12/2006 |
| EP | 1993144 A1 | 11/2008 |

OTHER PUBLICATIONS

International Search Report Dated Mar. 31, 2011 for International Application No. PCT/US2010/057824.
P. Choulat et al., "Above 17% industrial type PERC Solar Cell on thin Multi-Crystalline Silicon Substrate", 22nd European Photovoltaic Solar Energy Conference, Sep. 3-7, 2007, Milan, Italy.

* cited by examiner

*Primary Examiner* — Harold Pyon
*Assistant Examiner* — Jaison Thomas

(57) ABSTRACT

An aluminum paste comprising particulate aluminum, an organic vehicle and glass frit selected from (i) lead-free glass frits with a softening point temperature in the range of 550 to 611° C. and containing 11 to 33 wt.-% of $SiO_2$, >0 to 7 wt.-% of $Al_2O_3$ and 2 to 10 wt.-% of $B_2O_3$ and (ii) lead-containing glass frits with a softening point temperature in the range of 571 to 636° C. and containing 53 to 57 wt.-% of PbO, 25 to 29 wt.-% of $SiO_2$, 2 to 6 wt.-% of $Al_2O_3$ and 6 to 9 wt.-% of $B_2O_3$, useful in the production of aluminum back electrodes of PERC silicon solar cells.

5 Claims, No Drawings

ALUMINUM PASTES AND USE THEREOF IN THE PRODUCTION OF PASSIVATED EMITTER AND REAR CONTACT SILICON SOLAR CELLS

FIELD OF THE INVENTION

The present invention is directed to aluminum pastes, and their use in the production of PERC (passivated emitter and rear contact) silicon solar cells, i.e., in the production of aluminum back electrodes of silicon solar cells of the PERC cell type and the respective silicon solar cells.

TECHNICAL BACKGROUND OF THE INVENTION

Typically, silicon solar cells have both front- and back-side metallizations (front and back electrodes). A conventional silicon solar cell structure with a p-type base uses a negative electrode to contact the front-side or sun side of the cell, and a positive electrode on the back-side. It is well known that radiation of an appropriate wavelength falling on a p-n junction of a semiconductor body serves as a source of external energy to generate electron-hole pairs in that body. The potential difference that exists at a p-n junction, causes holes and electrons to move across the junction in opposite directions, thereby giving rise to flow of an electric current that is capable of delivering power to an external circuit. Most solar cells are in the form of a silicon wafer that has been metallized, i.e., provided with metal contacts which are electrically conductive.

The majority of the solar cells currently produced are based upon crystalline silicon. A popular method for depositing electrodes is the screen printing of metal pastes.

PERC silicon solar cells are well-known to the skilled person; see, for example, P. Choulat et al., "Above 17% industrial type PERC Solar Cell on thin Multi-Crystalline Silicon Substrate", 22$^{nd}$ European Photovoltaic Solar Energy Conference, 3-7 Sep. 2007, Milan, Italy.

PERC silicon solar cells represent a special type of conventional silicon solar cells; they are distinguished by having a dielectric passivation layer on their front- and on their back-side. The passivation layer on the front-side serves as an ARC (antireflective coating) layer, as is conventional for silicon solar cells. The dielectric passivation layer on the back-side is perforated; it serves to extend charge carrier lifetime and as a result thereof improves light conversion efficiency. It is desired to avoid damage of the perforated dielectric back-side passivation layer as much as possible.

Similar to the production of a conventional silicon solar cell, the production of a PERC silicon solar cell typically starts with a p-type silicon substrate in the form of a silicon wafer on which an n-type diffusion layer (n-type emitter) of the reverse conductivity type is formed by the thermal diffusion of phosphorus (P) or the like. Phosphorus oxychloride ($POCl_3$) is commonly used as the gaseous phosphorus diffusion source, other liquid sources are phosphoric acid and the like. In the absence of any particular modification, the n-type diffusion layer is formed over the entire surface of the silicon substrate. The p-n junction is formed where the concentration of the p-type dopant equals the concentration of the n-type dopant. The cells having the p-n junction close to the sun side, have a junction depth between 0.05 and 0.5 μm.

After formation of this diffusion layer excess surface glass is removed from the rest of the surfaces by etching by an acid such as hydrofluoric acid.

Next, a dielectric layer, for example, of $TiO_x$, $SiO_x$, $TiO_x$/$SiO_x$, $SiN_x$ or, in particular, a dielectric stack of $SiN_x$/$SiO_x$ is formed on the front-side n-type diffusion layer. As a specific feature of the PERC silicon solar cell, the dielectric is also deposited on the back-side of the silicon wafer to a thickness of, for example, between 0.05 and 0.1 μm. Deposition of the dielectric may be performed, for example, using a process such as plasma CVD (chemical vapor deposition) in the presence of hydrogen or sputtering. Such a layer serves as both an ARC and passivation layer for the front-side and as a dielectric passivation layer for the back-side of the PERC silicon solar cell. The passivation layer on the back-side of the PERC silicon solar cell is then perforated. The perforations are typically produced by acid etching or laser drilling and the holes so produced are, for example, 50 to 300 μm in diameter. Their depth corresponds to the thickness of the passivation layer or may even slightly exceed it. The number of the perforations lies in the range of, for example, 100 to 500 per square centimeter.

Just like a conventional solar cell structure with a p-type base and a front-side n-type emitter, PERC silicon solar cells typically have a negative electrode on their front-side and a positive electrode on their back-side. The negative electrode is typically applied as a grid by screen printing and drying a front-side silver paste (front electrode forming silver paste) on the ARC layer on the front-side of the cell. The front-side grid electrode is typically screen printed in a so-called H pattern which comprises thin parallel finger lines (collector lines) and two busbars intersecting the finger lines at right angle. In addition, a back-side silver or silver/aluminum paste and an aluminum paste are applied, typically screen printed, and successively dried on the perforated passivation layer on the back-side of the p-type silicon substrate. Normally, the back-side silver or silver/aluminum paste is applied onto the back-side perforated passivation layer first to form anodic back contacts, for example, as two parallel busbars or as rectangles or tabs ready for soldering interconnection strings (presoldered copper ribbons). The aluminum paste is then applied in the bare areas with a slight overlap over the back-side silver or silver/aluminum. In some cases, the silver or silver/aluminum paste is applied after the aluminum paste has been applied. Firing is then typically carried out in a belt furnace for a period of 1 to 5 minutes with the wafer reaching a peak temperature in the range of 700 to 900° C. The front electrode and the back electrodes can be fired sequentially or cofired.

The aluminum paste is generally screen printed and dried on the perforated dielectric passivation layer on the back-side of the silicon wafer. The wafer is fired at a temperature above the melting point of aluminum to form an aluminum-silicon melt at the local contacts between the aluminum and the silicon, i.e. at those parts of the silicon wafer's back-surface not covered by the dielectric passivation layer or, in other words, at the places of the perforations. The so-formed local p+ contacts are generally called local BSF (back surface field) contacts. The aluminum paste is transformed by firing from a dried state to an aluminum back electrode, whereas the back-side silver or silver/aluminum paste becomes a silver or silver/aluminum back electrode upon firing. Typically, aluminum paste and back-side silver or silver/aluminum paste are cofired, although sequential firing is also possible. During firing, the boundary between the back-side aluminum and the back-side silver or silver/aluminum assumes an alloy state, and is connected electrically as well. The aluminum electrode accounts for most areas of the back electrode. A silver or silver/aluminum back electrode is formed over portions of the back-side as an anode for interconnecting solar cells by means of pre-soldered copper ribbon or the like. In addition, the front-side silver paste printed as front-side cathode etches and penetrates through the ARC layer during firing, and is thereby able to electrically contact the n-type layer. This type of process is generally called "firing through".

SUMMARY OF THE INVENTION

The present invention relates to aluminum pastes (aluminum thick film compositions) that can be used for forming aluminum back electrodes of PERC silicon solar cells. It further relates to the process of forming and use of the aluminum pastes in the production of PERC silicon solar cells and the PERC silicon solar cells themselves.

The present invention is directed to aluminum pastes comprising particulate aluminum, an organic vehicle and at least one glass frit selected from the group consisting of (i) lead-free glass frits with a softening point temperature in the range of 550 to 611° C. and containing 11 to 33 wt.-% (weight-%) of $SiO_2$, >0 to 7 wt.-%, in particular 5 to 6 wt.-% of $Al_2O_3$ and 2 to 10 wt.-% of $B_2O_3$ and (ii) lead-containing glass frits with a softening point temperature in the range of 571 to 636° C. and containing 53 to 57 wt.-% of PbO, 25 to 29 wt.-% of $SiO_2$, 2 to 6 wt.-% of $Al_2O_3$ and 6 to 9 wt.-% of $B_2O_3$.

In the description and the claims the term "softening point temperature" is used. It shall mean the glass transition temperature, determined by differential thermal analysis DTA at a heating rate of 10 K/min.

The present invention is further directed to a process of forming a PERC silicon solar cell and the PERC silicon solar cell itself which utilizes a silicon wafer having a p-type and an n-type region, a p-n junction, a front-side ARC layer and a back-side perforated dielectric passivation layer, which comprises applying, for example printing, in particular screen-printing, an aluminum paste of the present invention on the back-side perforated dielectric passivation layer, and firing the aluminum paste so applied, whereby the wafer reaches a peak temperature in the range of 700 to 900° C.

DETAILED DESCRIPTION OF THE INVENTION

It has been found that the aluminum pastes of the present invention allow for the production of PERC silicon solar cells with improved electrical efficiency. The fired aluminum pastes adhere well to the back-side perforated passivation layer and thus give rise to a long durability or service life of the PERC silicon solar cells produced with the aluminum pastes of the present invention.

Without being bound to theory it is believed that the aluminum pastes of the present invention do not or not significantly damage the perforated dieelectric passivation layer on the silicon wafer's back-side and/or exhibit no or only reduced escaping of aluminum-silicon alloy through the perforations in the silicon wafer's back-side passivation layer during firing.

The aluminum pastes of the present invention have no or only poor fire-through capability. They comprise particulate aluminum, an organic vehicle and at least one glass frit selected from the group consisting of (i) lead-free glass frits with a softening point temperature in the range of 550 to 611° C. and containing 11 to 33 wt.-% of $SiO_2$, >0 to 7 wt.-%, in particular 5 to 6 wt.-% of $Al_2O_3$ and 2 to 10 wt.-% of $B_2O_3$ and (ii) lead-containing glass frits with a softening point temperature in the range of 571 to 636° C. and containing 53 to 57 wt.-% of PbO, 25 to 29 wt.-% of $SiO_2$, 2 to 6 wt.-% of $Al_2O_3$ and 6 to 9 wt.-% of $B_2O_3$.

In the present description and the claims the term "fire-through capability" is used. It shall mean the ability of a metal paste to etch and penetrate through (fire through) a passivation or ARC layer during firing. In other words, a metal paste with fire-through capability is one that fires through a passivation or an ARC layer making electrical contact with the surface of the silicon substrate. Correspondingly, a metal paste with poor or even no fire through capability makes no electrical contact with the silicon substrate upon firing. To avoid misunderstandings; in this context the term "no electrical contact" shall not be understood absolute; rather, it shall mean that the contact resistivity between fired metal paste and silicon surface exceeds 1 $\Omega \cdot cm^2$, whereas, in case of electrical contact, the contact resistivity between fired metal paste and silicon surface is in the range of 1 to 10 $\Omega \cdot cm^2$.

The contact resistivity can be measured by TLM (transfer length method). To this end, the following procedure of sample preparation and measurement may be used: A silicon wafer having a back-side passivation layer is screen printed on the passivation layer with the aluminum paste to be tested in a pattern of parallel 100 μm wide and 20 μm thick lines with a spacing of 2.05 mm between the lines and is then fired with the wafer reaching a peak temperature of 730° C. It is preferred for the sample preparation to use a silicon wafer with the same type of, but non-perforated, back-side passivation layer as is used in the process of the present invention, i.e. in the process of forming PERC silicon solar cells making use of the aluminum pastes of the present invention. The fired wafer is laser-cutted into 8 mm by 42 mm long strips, where the parallel lines do not touch each other and at least 6 lines are included. The strips are then subject to conventional TLM measurement at 20° C. in the dark. The TLM measurement can be carried out using the device GP 4-Test Pro from GP Solar.

The particulate aluminum may be comprised of aluminum or an aluminum alloy with one or more other metals like, for example, zinc, tin, silver and magnesium. In case of aluminum alloys the aluminum content is, for example, 99.7 to below 100 wt. %. The particulate aluminum may comprise aluminum particles in various shapes, for example, aluminum flakes, spherical-shaped aluminum powder, nodular-shaped (irregular-shaped) aluminum powder or any combinations thereof. In an embodiment, the particulate aluminum is aluminum powder. The aluminum powder exhibits an average particle size of, for example, 4 to 12 μm. The particulate aluminum may be present in the aluminum pastes in a proportion of 50 to 80 wt. %, or, in an embodiment, 70 to 75 wt. %, based on total aluminum paste composition.

In the present description and the claims the term "average particle size" is used. It shall mean the average particle size (mean particle diameter, d50) determined by means of laser scattering.

All statements made in the present description and the claims in relation to average particle sizes relate to average particle sizes of the relevant materials as are present in the aluminum paste composition.

The particulate aluminum present in the aluminum pastes may be accompanied by other particulate metal(s) such as, for example, silver or silver alloy powders. The proportion of such other particulate metal(s) is, for example, 0 to 10 wt. %, based on the total of particulate aluminum plus other particulate metal(s).

The aluminum pastes of the present invention comprise an organic vehicle. A wide variety of inert viscous materials can be used as organic vehicle. The organic vehicle may be one in which the particulate constituents (particulate aluminum, optionally present other particulate metals, glass frit, further optionally present inorganic particulate constituents) are dispersible with an adequate degree of stability. The properties, in particular, the rheological properties, of the organic vehicle may be such that they lend good application properties to the aluminum paste composition, including: stable dispersion of insoluble solids, appropriate viscosity and thixotropy for application, in particular, for screen printing, appropriate wettability of the silicon wafer's back-side perforated passivation layer and the paste solids, a good drying rate, and good firing properties. The organic vehicle used in the aluminum pastes of the present invention may be a nonaqueous inert liquid. The organic vehicle may be an organic solvent or an organic solvent mixture; in an embodiment, the organic vehicle may be a solution of organic polymer(s) in organic solvent(s). In an embodiment, the polymer used for this purpose may be ethyl cellulose. Other examples of polymers which may be used alone or in combination include ethylhydroxyethyl cellulose, wood rosin, phenolic resins and poly (meth)acrylates of lower alcohols. Examples of suitable organic solvents comprise ester alcohols and terpenes such as alpha- or beta-terpineol or mixtures thereof with other solvents such as kerosene, dibutylphthalate, diethylene glycol butyl ether, diethylene glycol butyl ether acetate, hexylene glycol and high boiling alcohols. In addition, volatile organic solvents for promoting rapid hardening after application of the aluminum paste on the back-side perforated passivation layer can be included in the organic vehicle. Various combinations of these and other solvents may be formulated to obtain the viscosity and volatility requirements desired.

The organic vehicle content in the aluminum pastes of the present invention may be dependent on the method of applying the paste and the kind of organic vehicle used, and it can vary. In an embodiment, it may be from 20 to 45 wt. %, or, in an embodiment, it may be in the range of 22 to 35 wt. %, based on total aluminum paste composition. The number of 20 to 45 wt. % includes organic solvent(s), possible organic polymer(s) and possible organic additive(s).

The organic solvent content in the aluminum pastes of the present invention may be in the range of 5 to 25 wt. %, or, in an embodiment, 10 to 20 wt. %, based on total aluminum paste composition.

The organic polymer(s) may be present in the organic vehicle in a proportion in the range of 0 to 20 wt.%, or, in an embodiment, 5 to 10 wt. %, based on total aluminum paste composition.

The aluminum pastes of the present invention comprise at least one glass frit as inorganic binder. The at least one glass frit is selected from the group consisting of (i) lead-free glass frits with a softening point temperature in the range of 550 to 611° C. and containing 11 to 33 wt.-% of $SiO_2$, >0 to 7 wt.-%, in particular 5 to 6 wt.-% of $Al_2O_3$ and 2 to 10 wt.-% of $B_2O_3$ and (ii) lead-containing glass frits with a softening point temperature in the range of 571 to 636° C. and containing 53 to 57 wt.-% of PbO, 25 to 29 wt.-% of $SiO_2$, 2 to 6 wt.-% of $Al_2O_3$ and 6 to 9 wt.-% of $B_2O_3$.

In case of the lead-free glass frits of type (i), the weight percentages of $SiO_2$, $Al_2O_3$ and $B_2O_3$ do not total 100 wt.-% and the missing wt.-% are in particular contributed by one or more other oxides, for example, alkali metal oxides like $Na_2O$, alkaline earth metal oxides like MgO and metal oxides like $Bi_2O_3$, $TiO_2$ and ZnO.

The lead-free glass frits of type (i) may contain 40 to 73 wt.-%, in particular 48 to 73 wt.-% of $Bi_2O_3$. The weight percentages of $Bi_2O_3$, $SiO_2$, $Al_2O_3$ and $B_2O_3$ may or may not total 100 wt.-%. In case they do not total 100 wt.-% the missing wt.-% may in particular be contributed by one or more other oxides, for example, alkali metal oxides like $Na_2O$, alkaline earth metal oxides like MgO and metal oxides like $TiO_2$ and ZnO.

In case of the lead-containing glass frits of type (ii), the weight percentages of PbO, $SiO_2$, $Al_2O_3$ and $B_2O_3$ may or may not total 100 wt.-%. In case they do not total 100 wt.-% the missing wt.-% may in particular be contributed by one or more other oxides, for example, alkali metal oxides like $Na_2O$, alkaline earth metal oxides like MgO and metal oxides like $TiO_2$ and ZnO.

In case the aluminum pastes of the present invention comprise lead-free glass frit of type (i) as well as lead-containing glass frit of type (ii), the ratio between both glass frit types may be any or, in other words, in the range of from >0 to infinity. Generally, the aluminum pastes comprise no glass frit other than glass frit selected from the group consisting of types (i) and (ii).

The average particle size of the glass frit(s) is in the range of, for example, 0.5 to 4 μm. The total content of glass frit selected from the group consisting of types (i) and (ii) in the aluminum pastes of the present invention is, for example, 0.25 to 8 wt.-%, or, in an embodiment, 0.8 to 3.5 wt.-%.

The preparation of the glass frits is well known and consists, for example, in melting together the constituents of the glass, in particular in the form of the oxides of the constituents, and pouring such molten composition into water to form the frit. As is well known in the art, heating may be conducted to a peak temperature in the range of, for example, 1050 to 1250° C. and for a time such that the melt becomes entirely liquid and homogeneous, typically, 0.5 to 1.5 hours.

The glass may be milled in a ball mill with water or inert low viscosity, low boiling point organic liquid to reduce the particle size of the frit and to obtain a frit of substantially uniform size. It may then be settled in water or said organic liquid to separate fines and the supernatant fluid containing the fines may be removed. Other methods of classification may be used as well.

The aluminum pastes of the present invention may comprise refractory inorganic compounds and/or metal-organic compounds. "Refractory inorganic compounds" refers to inorganic compounds that are resistant to the thermal conditions experienced during firing. For example, they have melting points above the temperatures experienced during firing. Examples include solid inorganic oxides, for example, amorphous silicon dioxide. Examples of metal-organic compounds include tin- and zinc-organic compounds such as zinc neodecanoate and tin(II) 2-ethylhexanoate.

With regard to adhesion of the fired aluminum paste to the back-side perforated passivation layer it may be advantageous for the aluminum paste to contain a small amount of at least one antimony oxide. Therefore, in an embodiment, the aluminum pastes of the present invention may comprise at least one antimony oxide. The at least one antimony oxide may be contained in the aluminum pastes in a total proportion of, for example, 0.05 to 1.5 wt.-%, based on total aluminum paste composition, wherein the at least one antimony oxide may be present as separate particulate constituent(s) and/or as glass frit constituent(s). Examples of suitable antimony oxides include $Sb_2O_3$ and $Sb_2O_5$, wherein $Sb_2O_3$ is the preferred antimony oxide.

The aluminum pastes of the present invention may comprise one or more organic additives, for example, surfactants, thickeners, rheology modifiers and stabilizers. The organic additive(s) may be part of the organic vehicle. However, it is also possible to add the organic additive(s) separately when preparing the aluminum pastes. The organic additive(s) may be present in the aluminum pastes of the present invention in a total proportion of, for example, 0 to 10 wt. %, based on total aluminum paste composition.

The aluminum pastes of the present invention are viscous compositions, which may be prepared by mechanically mixing the particulate aluminum and the glass frit(s) with the organic vehicle. In an embodiment, the manufacturing method power mixing, a dispersion technique that is equivalent to the traditional roll milling, may be used; roll milling or other mixing technique can also be used.

The aluminum pastes of the present invention can be used as such or may be diluted, for example, by the addition of additional organic solvent(s); accordingly, the weight percentage of all the other constituents of the aluminum pastes may be decreased.

The aluminum pastes of the present invention may be used in the manufacture of aluminum back electrodes of PERC silicon solar cells or respectively in the manufacture of PERC silicon solar cells. The manufacture may be performed by applying the aluminum pastes to the back-side of silicon wafers provided with a front-side ARC layer and a back-side perforated dielectric passivation layer, i.e., to those back-side surface portions thereof which are or will not be covered by other back-side metal pastes like, in particular, back-side silver or silver/aluminum pastes. After application of the aluminum pastes they are fired to form an aluminum back electrode.

Accordingly, the present invention also relates to a process for the production of an aluminum back electrode of a PERC silicon solar cell and, respectively, to a process for the production of a PERC silicon solar cell comprising the steps:
(1) providing a silicon wafer having an ARC layer on its front-side and a perforated dielectric passivation layer on its back-side,
(2) applying and drying an aluminum paste of the present invention on the perforated dielectric passivation layer on the back-side of the silicon wafer, and
(3) firing the dried aluminum paste, whereby the wafer reaches a peak temperature of 700 to 900° C.

In step (1) of the process of the present invention a silicon wafer having an ARC layer on its front-side and a perforated dielectric passivation layer on its back-side is provided. The silicon wafer is a mono- or polycrystalline silicon wafer as is conventionally used for the production of silicon solar cells; it has a p-type region, an n-type region and a p-n junction. The silicon wafer has an ARC layer on its front-side and a perforated dielectric passivation layer on its back-side, both layers, for example, of $TiO_x$, $SiO_x$, $TiO_x/SiO_x$, $SiN_x$ or, in particular, a dielectric stack of $SiN_x/SiO_x$. Such silicon wafers are well known to the skilled person; for brevity reasons reference is expressly made to the section "TECHNICAL BACKGROUND OF THE INVENTION". The silicon wafer may already be provided with the conventional front-side metallizations, i.e. with a front-side silver paste as described above in the section "TECHNICAL BACKGROUND OF THE INVENTION". Application of the front-side metallization may be carried out before or after the aluminum back electrode is finished.

In step (2) of the process of the present invention an aluminum paste of the present invention is applied on the perforated dielectric passivation layer on the back-side of the silicon wafer, i.e. covering the dielectric as well as the perforations.

The aluminum pastes of the present invention are applied to a dry film thickness of, for example, 15 to 60 μm. Typically, they are applied as a single layer. The method of aluminum paste application may be printing, for example, silicone pad printing or, in an embodiment, screen printing. The application viscosity of the aluminum pastes of the present invention may be 20 to 200 Pa·s when it is measured at a spindle speed of 10 rpm and 25° C. by a utility cup using a Brookfield HBT viscometer and #14 spindle.

After application, the aluminum paste is dried, for example, for a period of 1 to 100 minutes with the silicon wafer reaching a peak temperature in the range of 100 to 300° C. Drying can be carried out making use of, for example, belt, rotary or stationary driers, in particular, IR (infrared) belt driers.

In step (3) of the process of the present invention the dried aluminum paste is fired to form an aluminum back electrode. The firing of step (3) may be performed, for example, for a period of 1 to 5 minutes with the silicon wafer reaching a peak temperature in the range of 700 to 900° C. The firing can be carried out making use of, for example, single or multi-zone belt furnaces, in particular, multi-zone IR belt furnaces. The firing may happen in an inert gas atmosphere or in the presence of oxygen, for example, in the presence of air. During firing the organic substance including non-volatile organic material and the organic portion not evaporated during the drying may be removed, i.e. burned and/or carbonized, in particular, burned. The organic substance removed during firing includes organic solvent(s), optionally present organic polymer(s), optionally present organic additive(s) and the organic moieties of optionally present metal-organic compounds. There is a further process taking place during firing, namely sintering of the glass frit with the particulate aluminum. During firing the aluminum paste does not fire through the back-side perforated passivation layer, but it makes local contacts with the silicon substrate back surface at the places of the perforations in the passivation layer and forms local BSF contacts, i.e. the passivation layer survives at least essentially between the fired aluminum paste and the silicon substrate.

Firing may be performed as so-called cofiring together with other metal pastes that have been applied to the PERC solar cell silicon wafer, i.e., front-side and/or back-side metal pastes which have been applied to form front-side and/or back-side electrodes on the wafer's surfaces during the firing process. An embodiment includes front-side silver pastes and back-side silver or back-side silver/aluminum pastes. In an embodiment, such back-side silver or back-side silver/aluminum paste is a silver or silver/aluminum paste having no or only poor fire-through capability. A back-side silver or back-side silver/aluminum paste without or with only poor fire-through capability does not etch through the back-side perforated passivation layer during firing; thus it makes only local physical contact with the silicon back-surface of the wafer at the places of the perforations in the passivation layer.

EXAMPLE (1) Manufacture of Test Samples:
(i) Example Aluminum Paste

The example aluminum paste comprised 72 wt.-% air-atomized aluminum powder (d50=6 μm), 26.5 wt.-% organic vehicle of polymeric resins and organic solvents, 0.5 wt.-% of $Sb_2O_3$ and 1 wt.-% of glass frit. The glass frit composition was: 28 wt.-% $SiO_2$, 4.7 wt.-% $Al_2O_3$, 8.1 wt.-% $B_2O_3$, 55.9 wt.-% PbO and 3.3 wt.-% $TiO_2$; the glass had a softening point temperature of 573° C.
(ii) Formation of TLM Samples A p-type multicrystalline silicon wafer of 80 $cm^2$ area and 160 μm thickness with an n-type diffused $POCl_3$ emitter, having a $SiN_x$ ARC on the front-side and a non-perforated 100 nm thick $SiO_2/SiN_x$ rear surface dielectric stack, was screen printed on the back surface with parallel lines of the example aluminum paste. The aluminum paste was patterned at a nominal line width of 100 μm with a line spacing (pitch) of 2.05 mm; the dried film thickness of the aluminum paste was 20 μm.

The printed wafer was then fired in a 6-zone infrared furnace supplied by Despatch. A belt speed of 580 cm/min was used with zone temperatures defined as zone 1=500° C., zone 2=525° C., zone 3=550° C., zone 4=600° C., zone 5=900° C. and the final zone set at 865° C. Using a DataPaq thermal data logger the peak wafer temperature was found to reach 730° C.

The fired wafer was subsequently laser scribed and fractured into 8 mm×42 mm TLM samples, where the parallel aluminum metallization lines did not touch each other. Laser scribing was performed using a 1064 nm infrared laser supplied by Optek.

(iii) Formation of an Adhesion Test Sample

A p-type multicrystalline silicon wafer of 243 $cm^2$ area and 160 μm thickness with an n-type diffused $POCl_3$ emitter, having a $SiN_x$ ARC on the front-side and a non-perforated $SiO_2/SiN_x$ rear surface dielectric stack was provided. The dielectric stack was processed using a 1064 nm wavelength laser to achieve multiple circular openings of 100 μm diameter, with a spacing (pitch) of 600 μm. After laser ablation the wafer was subsequently screen printed full plane with the example aluminum paste and then dried. The aluminum paste had a dried layer thickness of 30 μm.

The printed and dried wafer was then fired in a 6-zone infrared furnace supplied by Despatch. A belt speed of 580 cm/min was used with zone temperatures defined as zone 1=500° C., zone 2=525° C., zone 3=550° C., zone 4=600° C., zone 5=900° C. and the final zone set at 865° C. Using a DataPaq thermal data logger the peak wafer temperature was found to reach 730° C.

(2) Test Procedures:

(i) TLM Measurement

The TLM samples were measured by placing them into a GP 4-Test Pro instrument available from GP Solar for the purpose of measuring contact resistivity. The measurements were performed at 20° C. with the samples in darkness. The test probes of the apparatus made contact with 6 adjacent fine line aluminum electrodes of the TLM samples, and the contact resistivity (ρc) was recorded.

(ii) Fired Adhesion

In order to measure the cohesive strength of the aluminum metallizations the amount of material removed from the back face of the fired wafer was determined using a peel test. To this end, a transparent layer of adhesive tape (3M Scotch Magic tape grade 810) was firmly applied and subsequently removed by peeling at an angle of 45 degrees. By ratioing the area of residue on the tape to the area of material remaining on the wafer, a qualitative assessment of the adhesion could be made.

The example aluminum paste exhibited the following results:

Adhesion (area % without adhesion loss)=100%, no residue on the tape after the peel test.

The contact resistivity exceeded the upper measurable limit for the GP 4-Test Pro equipment (>364 Ω·$cm^2$).

What is claimed is:

1. An aluminum paste comprising particulate aluminum, an organic vehicle and at least one glass frit selected from the group consisting of (i) lead-free glass frits with a softening point temperature in the range of 550 to 611° C. and containing 11 to 33 wt.-% of $SiO_2$, >0 to 7 wt.-% of $Al_2O_3$ and 2 to 10 wt.-% of $B_2O_3$ and (ii) lead-containing glass frits with a softening point temperature in the range of 571 to 636 °C. and containing 53 to 57 wt.-% of PbO, 25 to 29 wt.-% of $SiO_2$, 2 to 6 wt.-% of $Al_2O_3$ and 6 to 9 wt.-% of $B_2O_3$, wherein the particulate aluminum is present in a proportion of 50 to 80 wt.%, based on total aluminum paste composition.

2. The aluminum paste of claim 1, wherein the organic vehicle content is from 20 to 45 wt. %, based on total aluminum paste composition.

3. The aluminum paste of claim 1, wherein one or more of the lead-free glass frits contain 40 to 73 wt.-% of $Bi_2O_3$.

4. The aluminum paste of claim 1, wherein the total content of glass frit selected from the group consisting of types (i) and (ii) in the aluminum paste is 0.25 to 8 wt.-%.

5. The aluminum paste of claim 1 comprising 0.05 to 1.5 wt.-% of at least one antimony oxide, based on total aluminum paste composition, wherein the at least one antimony oxide is present (i) as separate particulate constituent(s), (ii) as glass frit constituent(s) or (iii) as separate particulate constituent(s) and as glass frit constituent(s).

* * * * *